(12) United States Patent
Campbell et al.

(10) Patent No.: US 8,806,749 B2
(45) Date of Patent: Aug. 19, 2014

(54) TWO-PHASE, WATER-BASED IMMERSION-COOLING APPARATUS WITH PASSIVE DEIONIZATION

(71) Applicant: International Business Machines Corporation, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Lagrangeville, NY (US); Madhusudan K. Iyengar, Foster City, CA (US); Robert E. Simons, Poughkeepsie, NY (US); Prabjit Singh, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/684,724

(22) Filed: Nov. 26, 2012

(65) Prior Publication Data
US 2013/0081258 A1    Apr. 4, 2013

Related U.S. Application Data

(63) Continuation of application No. 13/187,556, filed on Jul. 21, 2011.

(51) Int. Cl.
*H01L 23/34* (2006.01)
*H01L 21/50* (2006.01)
*B21D 53/02* (2006.01)

(52) U.S. Cl.
USPC ............ 29/890.032; 361/679.54; 361/700; 361/711; 257/707; 257/715; 174/15.1; 165/80.4; 165/104.21; 165/104.33

(58) Field of Classification Search
USPC ............ 29/890.03, 890.032; 361/679.4, 361/679.46–679.55, 698–705, 708–720, 361/728; 257/675, 704–706, 714–716, 722; 174/15.1, 15.2, 16.3, 50; 165/80.2–80.4, 104.21–104.22, 104.33
See application file for complete search history.

(56) References Cited

U.S. PATENT DOCUMENTS

| 5,305,184 A | 4/1994 | Andresen et al. |
| 5,374,417 A | 12/1994 | Norfleet et al. |

(Continued)

OTHER PUBLICATIONS

Campbell et al., Notice of Allowance for U.S. Appl. No. 13/187,556, filed Jul. 21, 2011 (U.S. Patent Publication No. 2013/0021752 A1), dated Sep. 16, 2013 (12 pages).

(Continued)

*Primary Examiner* — David Bryant
*Assistant Examiner* — Jason L Vaughan
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses, cooled electronic modules and methods of fabrication are provided for fluid immersion-cooling of an electronic component(s). The method includes, for instance: securing a housing about an electronic component to be cooled, the housing at least partially surrounding and forming a compartment about the electronic component to be cooled; disposing a fluid within the compartment, wherein the electronic component to be cooled is at least partially immersed within the fluid, and wherein the fluid comprises water; and providing a deionizing structure within the compartment, the deionizing structure comprising deionizing material, the deionizing material ensuring deionization of the fluid within the compartment, wherein the deionizing structure is configured to accommodate boiling of the fluid within the compartment.

7 Claims, 8 Drawing Sheets

(56) References Cited

U.S. PATENT DOCUMENTS

| | | | |
|---|---|---|---|
| 6,684,652 B2 * | 2/2004 | Kim et al. | 62/185 |
| 6,717,812 B1 * | 4/2004 | Pinjala et al. | 361/699 |
| 7,254,024 B2 | 8/2007 | Salmon | |
| 7,403,392 B2 | 7/2008 | Attlesey et al. | |
| 7,656,025 B2 | 2/2010 | Laquer et al. | |
| 7,724,524 B1 | 5/2010 | Campbell et al. | |
| 7,885,070 B2 | 2/2011 | Campbell et al. | |
| 7,957,137 B2 * | 6/2011 | Prasher | 361/688 |
| 8,014,150 B2 | 9/2011 | Campbell et al. | |
| 8,018,720 B2 | 9/2011 | Campbell et al. | |
| 8,102,643 B2 | 1/2012 | Dittmer | |
| 8,179,677 B2 | 5/2012 | Campbell et al. | |
| 8,194,406 B2 | 6/2012 | Campbell et al. | |
| 8,387,249 B2 | 3/2013 | Campbell et al. | |
| 2003/0063430 A1 | 4/2003 | Shiue et al. | |
| 2009/0126910 A1 | 5/2009 | Campbell et al. | |
| 2010/0326628 A1 | 12/2010 | Campbell et al. | |
| 2010/0328889 A1 | 12/2010 | Campbell et al. | |
| 2010/0328890 A1 | 12/2010 | Campbell et al. | |
| 2011/0069452 A1 | 3/2011 | Campbell et al. | |
| 2011/0069453 A1 | 3/2011 | Campbell et al. | |
| 2012/0061059 A1 * | 3/2012 | Hsiao et al. | 165/104.33 |
| 2012/0063090 A1 * | 3/2012 | Hsiao et al. | 361/699 |
| 2013/0021752 A1 | 1/2013 | Campbell et al. | |
| 2013/0056181 A1 * | 3/2013 | Baerd et al. | 165/104.33 |

OTHER PUBLICATIONS

Melchiore, Dave, "Xoxide Resource Center: Water Cooling—How to Water Cool a Computer", Xoxide, Inc. (2005).

Product Literature: ResinTech MBD-10-SC, ResinTech, Inc., printed on Jun. 17, 2011.

Campbell et al. "Two-Phase, Water-Based Immersion Cooling Apparatus with Passive Deionization", U.S. Appl. No. 13/187,556, filed Jul. 21, 2011.

Campbell et al., Office Action for U.S. Appl. No. 13/187,556, filed Jul. 21, 2011 (U.S. Patent Publication No. 2013/0021752 A1), dated Mar. 20, 2014 (9 pages).

* cited by examiner

TWO-PHASE, WATER-BASED IMMERSION-COOLING APPARATUS WITH PASSIVE DEIONIZATION

CROSS-REFERENCE TO RELATED APPLICATION

This application is a continuation of U.S. Ser. No. 13/187,556, entitled "Two-Phase, Water-Based Immersion-Cooling Apparatus with Passive Deionization," filed Jul. 21, 2011, and which is hereby incorporated herein by reference in its entirety.

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, a method of fabricating a cooled electronic module is provided. The method includes: securing a housing about an electronic component to be cooled, the housing at least partially surrounding and forming a compartment about the electronic component to be cooled; disposing a fluid within the compartment, wherein the electronic component to be cooled is at least partially immersed within the fluid, and wherein the fluid comprises water; and providing a deionizing structure within the compartment, the deionizing structure comprising deionizing material, the deionizing material ensuring deionization of the fluid within the compartment, wherein the deionizing structure is configured to accommodate boiling of the fluid within the compartment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the terms "electronics rack" and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise multiple electronic subsystems or nodes, each having one or more heat-generating components disposed therein requiring cooling. "Electronic subsystem" refers to any sub-housing, blade, book, drawer, node, compartment, etc., having one or more heat-generating electronic components disposed therein. Each electronic subsystem of an electronics rack may be movable or fixed relative to the electronics rack, with the rack-mounted electronics drawers and blades of a blade center system being two examples of subsystems of an electronics rack to be cooled.

"Electronic component" refers to any heat-generating electronic device of, for example, a computer system or other electronics unit requiring cooling. By way of example, an electronic component may comprise one or more integrated circuit die (or chips) and/or other electronic devices to be cooled, including one or more processor chips, memory chips and memory support chips. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

Figure 1:
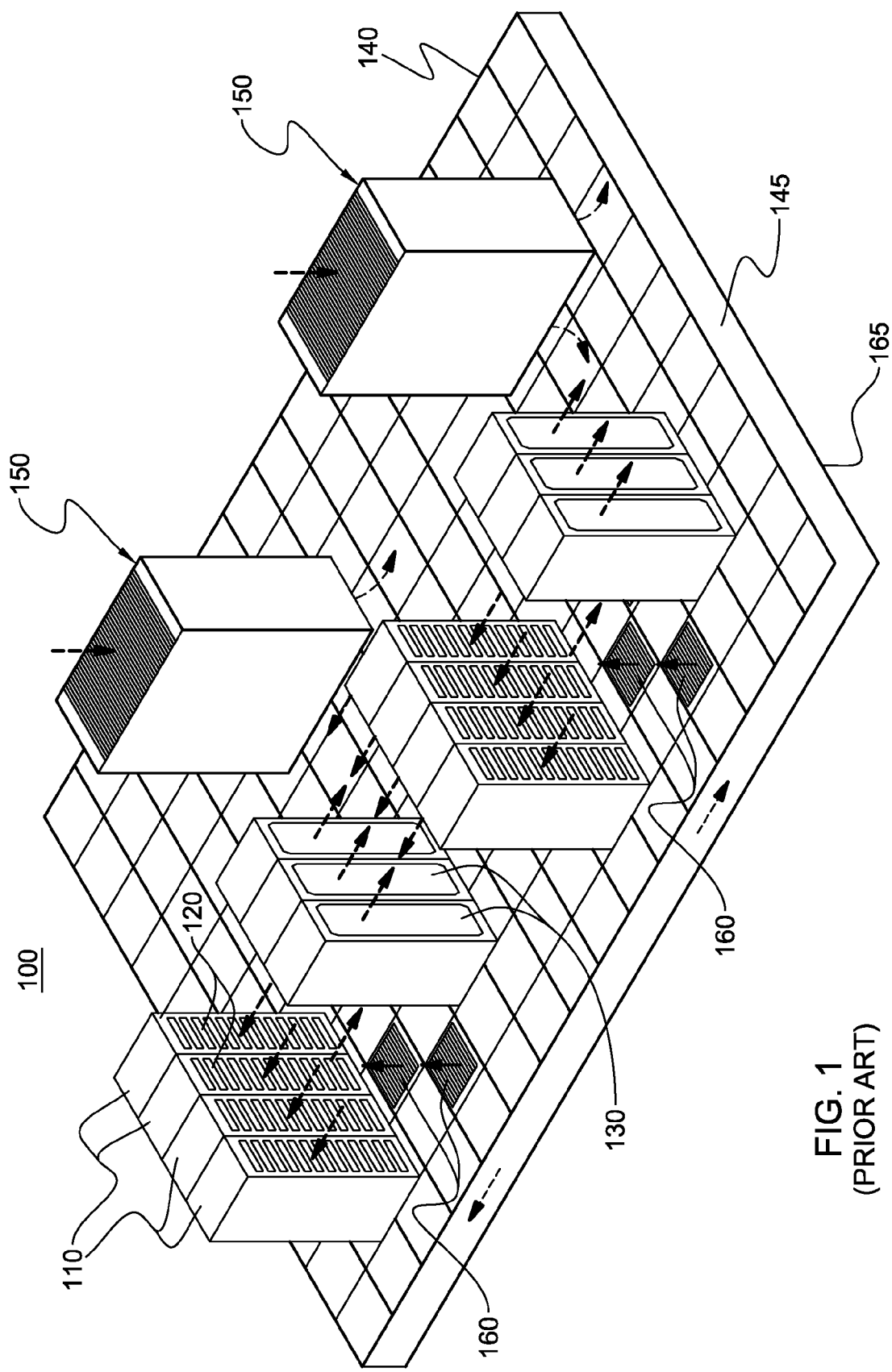
FIG. 1. depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Due to the ever-increasing airflow requirements through electronics racks, and the limits of air distribution within the typical data center installation, liquid-based cooling is being combined with the above-described conventional air-cooling.

Figure 2:
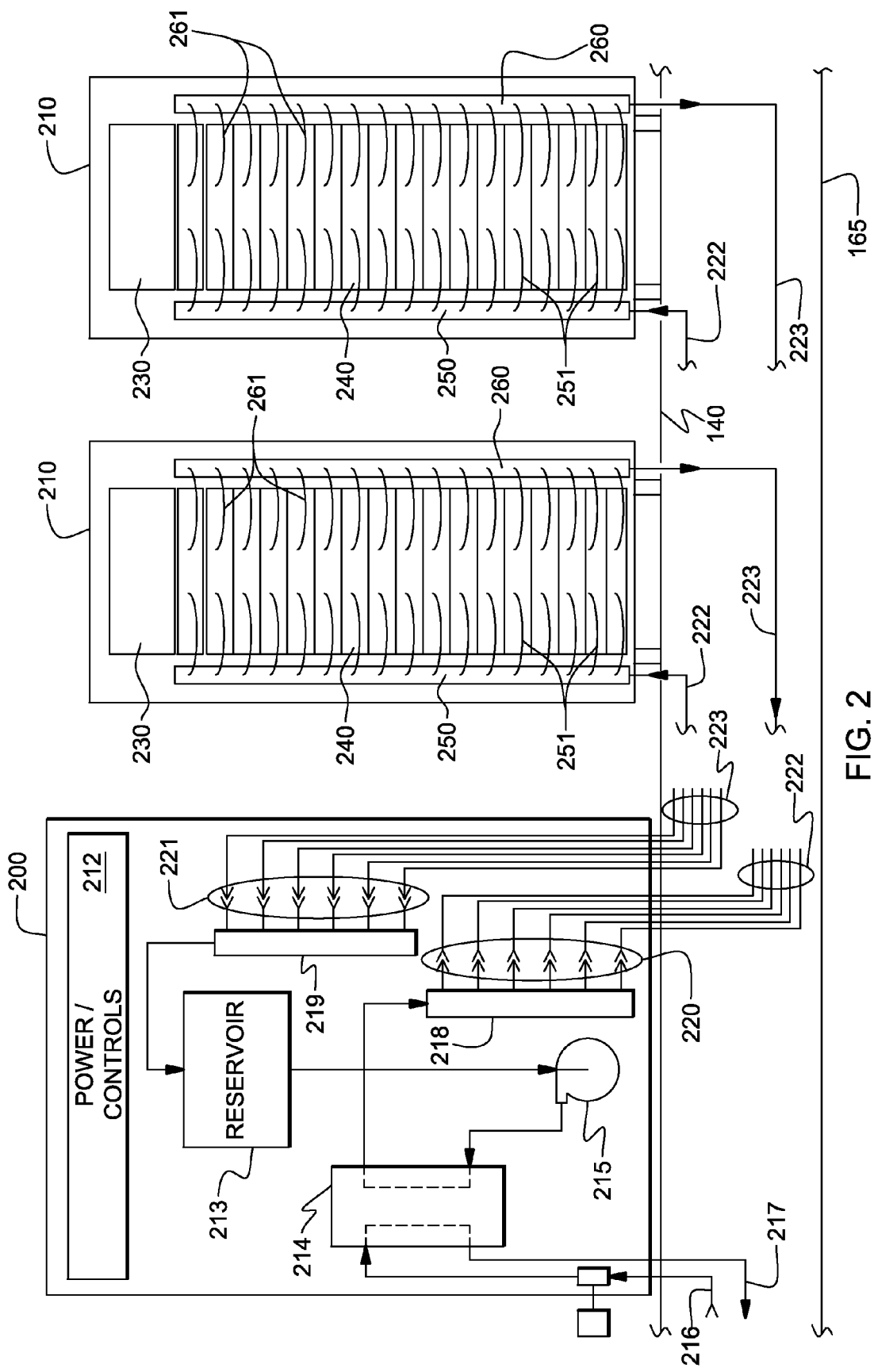
FIG. 2 depicts one embodiment of a coolant distribution unit facilitating liquid-cooling of electronics racks of a data center, in accordance with one or more aspects of the present invention.
Figure 3:
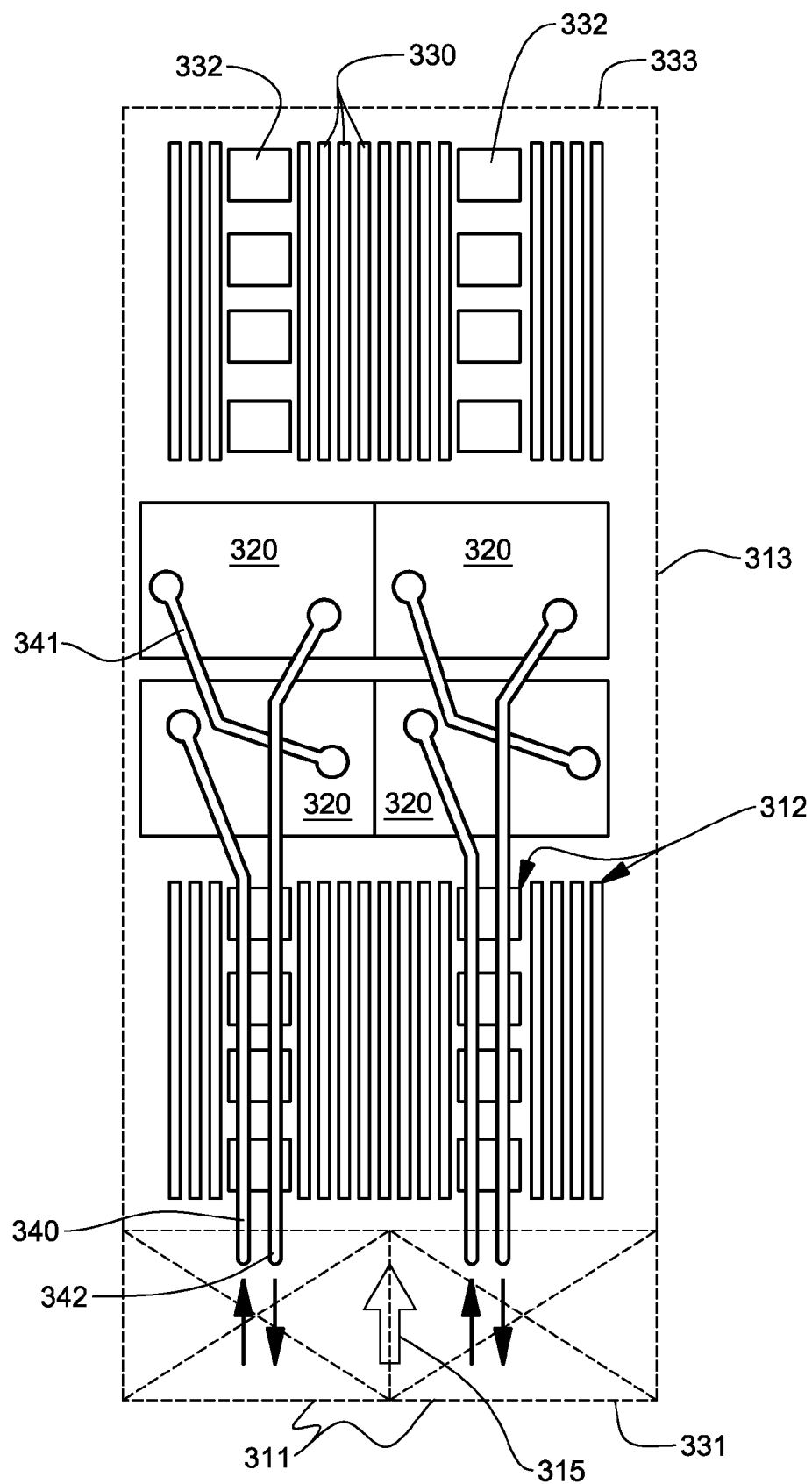
FIG. 3 is a plan view of one embodiment of an electronic subsystem (or node) layout illustrating an air and liquid cooling apparatus for cooling components of the electronic subsystem, in accordance with one or more aspects of the present invention.
Figure 4:
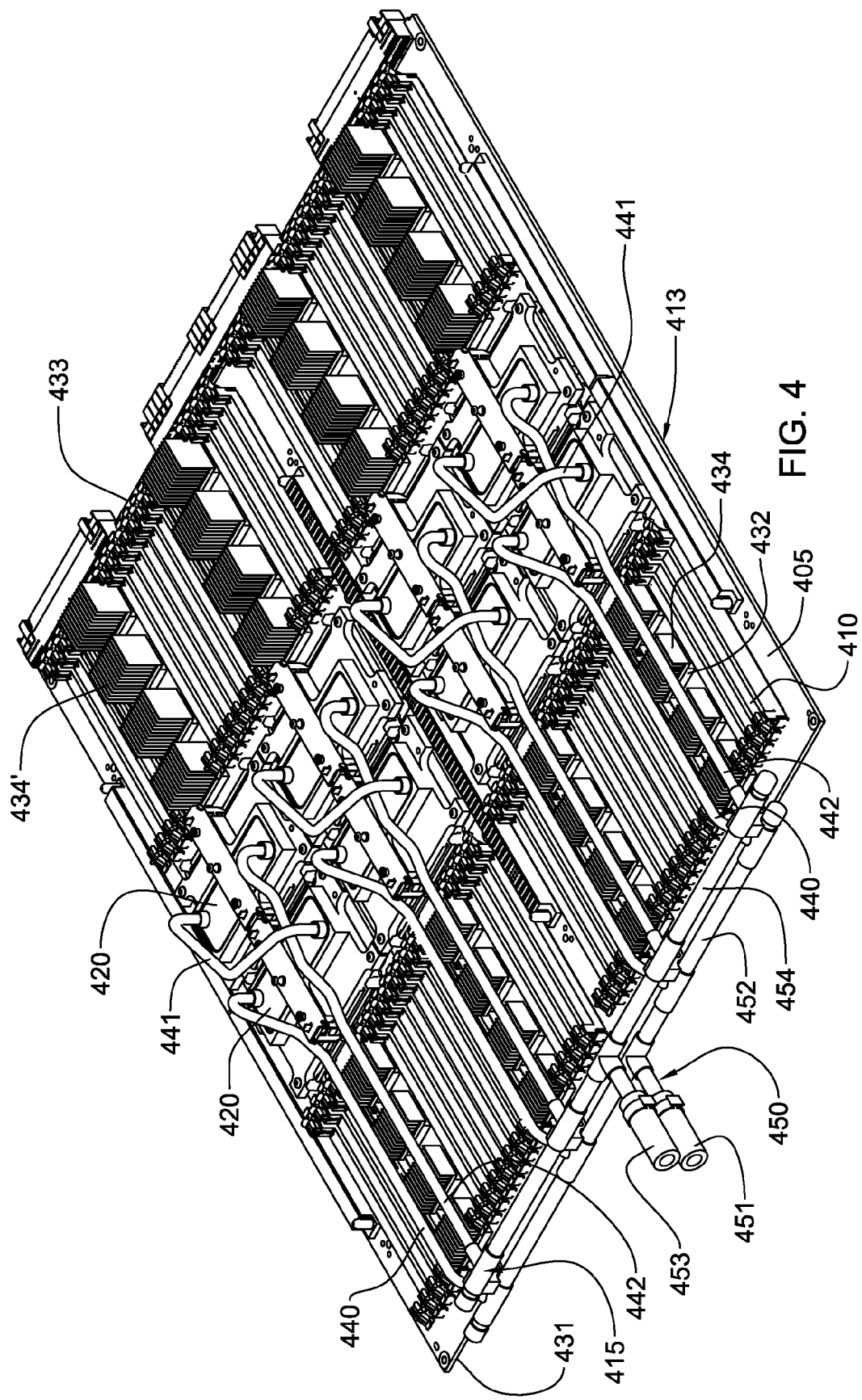
FIG. 4 depicts one detailed embodiment of a partially assembled electronic subsystem layout, wherein the electronic subsystem includes eight heat-generating electronic components to be cooled, each having, in one embodiment, a respective cooling apparatus associated therewith, in accordance with one or more aspects of the present invention.

FIGS. 2-4 illustrate one embodiment of a data center implementation employing a liquid-based cooling system with one or more cold plates coupled to high heat-generating electronic devices disposed within the electronics racks.

FIG. 2 depicts one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 210 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342. Note that in an alternate implementation, each liquid-cooled cold plate 320 could be coupled directly to a respective coolant supply tube 340 and coolant return tube 342, that is, without series connecting two or more of the liquid-cooled cold plates.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned (e.g., filtered) water.

FIG. 4 is an isometric view of one embodiment of an electronic subsystem or drawer, and monolithic cooling system. The depicted planar server assembly includes a multilayer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor die) to be cooled. In this embodiment, the electronic system is configured for (or as) a node of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

To facilitate heat transfer between the electronic components and the liquid-cooled structures, such as liquid-cooled cold plates described above, cooling apparatuses, cooled electronic modules and methods of fabrication thereof are disclosed hereinbelow which employ boiling heat transfer. In the embodiments described herein, the working fluid for the boiling heat transfer comprises water, and specially-shaped deionizing structures are provided which utilize, in one embodiment, deionizing material (e.g., resin material), which ensures continued deionization of the water-based fluid, within which the electronic component to be cooled is at least partially immersed. Employing immersion-cooling, in combination with a passive deionization structure, allows a superior coolant (i.e., a water-based coolant) to directly contact various parts of the electronic component, and thereby improve boiling heat transfer between the electronic component and the liquid-cooled structure of, for example, the above-described liquid-cooling system.

Figure 5:
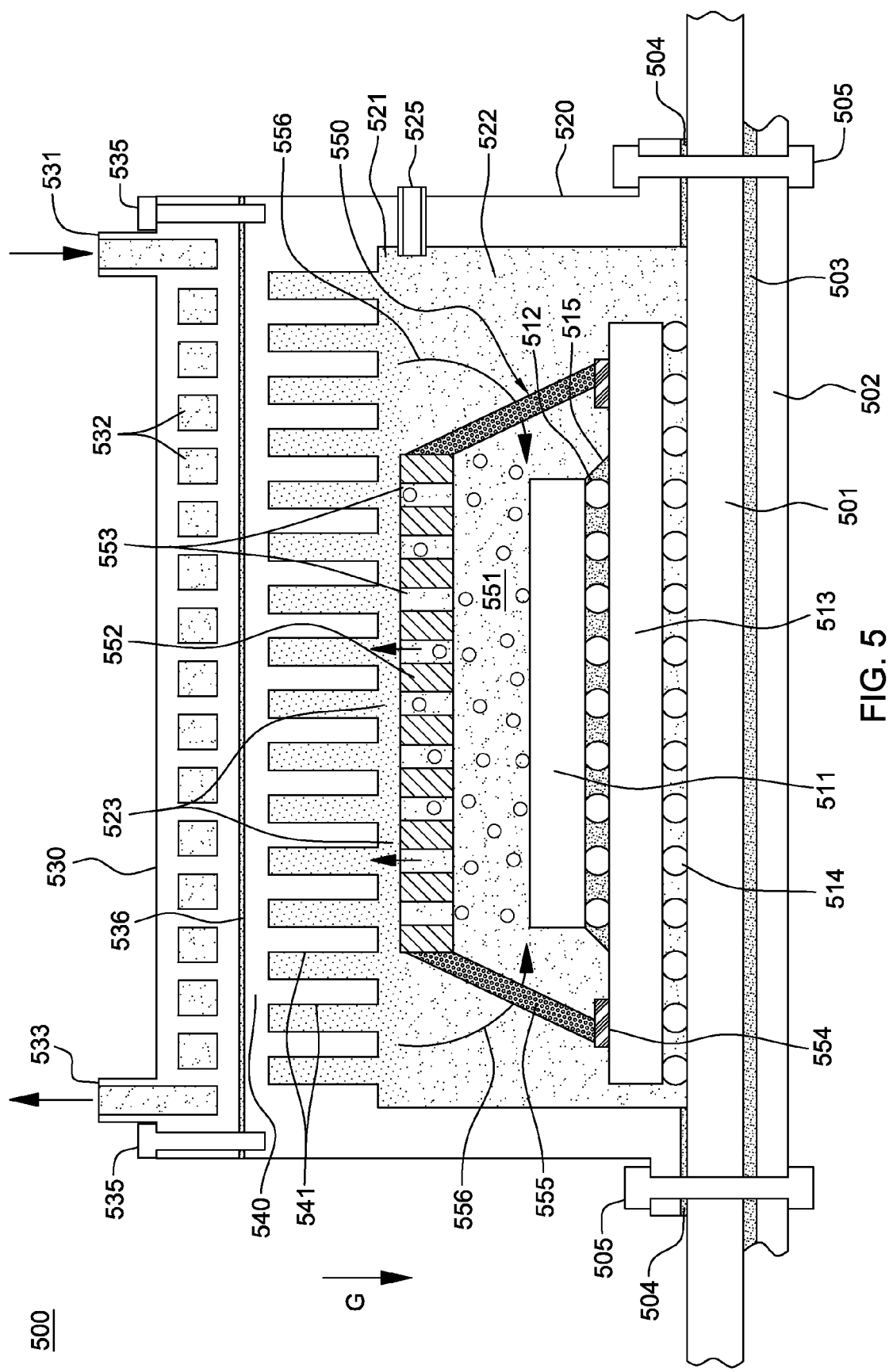
FIG. 5 is a cross-sectional elevational view of one embodiment of a cooled electronic module comprising an electronic component to be cooled and a cooling apparatus, in accordance with one or more aspects of the present invention.

FIG. 5 depicts one embodiment of a cooled electronic module, generally denoted 500, in accordance with one or more aspects of the present invention. Cooled electronic module 500 includes, in this embodiment, an electronic component 511, such as an electronic chip or package, coupled to a printed circuit board 501 (through substrate 513, and solder bumps 512, 514) with an associated back plate 502 (for example, a metal back plate). In this embodiment, an electrically non-conductive sealant 503 is disposed between printed circuit board 501 and back plate 502. A cooling apparatus comprising a housing (or casing) 520 is mechanically coupled via securing mechanisms 505 to back plate 502.

As illustrated in FIG. 5, housing 520 is configured to at least partially surround and form a compartment 521 about electronic component 511 to be cooled. In this embodiment, electronic component 511 is connected to a chip carrier (or substrate) 513 via, for example, a first plurality of solder ball connections 512. Substrate 513 is electrically connected to printed circuit board 501 via, for example, a second plurality of solder ball connections 514 (and an underfill material). An underfill material 515 surrounds the first plurality of solder ball connections 512, and seals the working fluid 522 within compartment 521 from the first plurality of electrical connections and, in one embodiment, the active surface of the electronic component 511 disposed in spaced, opposing relation to substrate 513.

The housing is a shell-like component that is attached to, for example, printed circuit board 501 using securing mechanisms 505, such as bolts or screws, and a sealing gasket 504, which is compressed between a lower surface of the housing and an upper surface of the board, or alternatively, between a lower surface of the housing and an upper surface of substrate 513, to which electronic component 511 directly couples. Note that as used herein, the word "substrate" refers to any underlying supporting structure, such as substrate 513 or printed circuit board 501 to which the electronic component is coupled, and to which the housing may be sealed in order to form a fluid-tight compartment 521 about the electronic component. Sealing gasket 504 seals off the compartment of the housing and assists in retaining the fluid within the sealed compartment.

As depicted, cooled electronic module 500 further includes a liquid-cooled cold plate 530 and a vapor-condensing region 540, disposed in an upper portion of the compartment 521. Liquid-cooled cold plate 530 is bolted 535 to housing 520, and comprises, in this embodiment, a plurality of channels 532 through which a coolant (such as water) circulates, as described above in connection with FIGS. 3-4. Coolant passes into the liquid-cooled cold plate through an inlet 531 and egresses through an outlet 533. Heat is conducted from the vapor-condenser structure 540 within compartment 521 across, in one embodiment, thermal interface material 536 to liquid-cooled cold plate 530 for rejection to the liquid coolant passing through the plurality of coolant-carrying channels of the liquid-cooled cold plate 530. In one embodiment, the condenser fins 541 of the vapor-condenser structure are appropriately sized for the anticipated layer of vapor 523 to form in the upper portion of the sealed compartment with operation of the heat-generating electronic component. Upon reaching the upper portion of the sealed compartment, the fluid vapor contacts the cool surfaces of the condenser fins. Upon making contact with the cool, vertically-oriented condenser fin surfaces, the fluid vapor undergoes a phase change process from vapor to liquid state, and the liquid droplets fall back downwards due to gravity and the liquid's relatively higher density compared with the neighboring vapor region. By way of example, the vertically-oriented condenser fins might comprise pin fin or plate fin structures. Further, the vertical length of the condenser fins may vary to facilitate heat transfer from the fluid vapor to the vapor-condensing structure.

Housing 520 also comprises, in the illustrated embodiment, a fluid fill port 525, which may be employed to charge the cooled electronic module with, for example, water-based fluid. The module can be charged with fluid by first pulling a vacuum through the fluid fill port 525, and then backfilling the compartment with the desired fluid charge. It is contemplated that once filled with fluid, the cooled electronic module will function without further servicing of the fluid. In this regard, the amount of deionization material (discussed below) is appropriately selected to last for the lifetime of the electronic module.

Figure 6A:
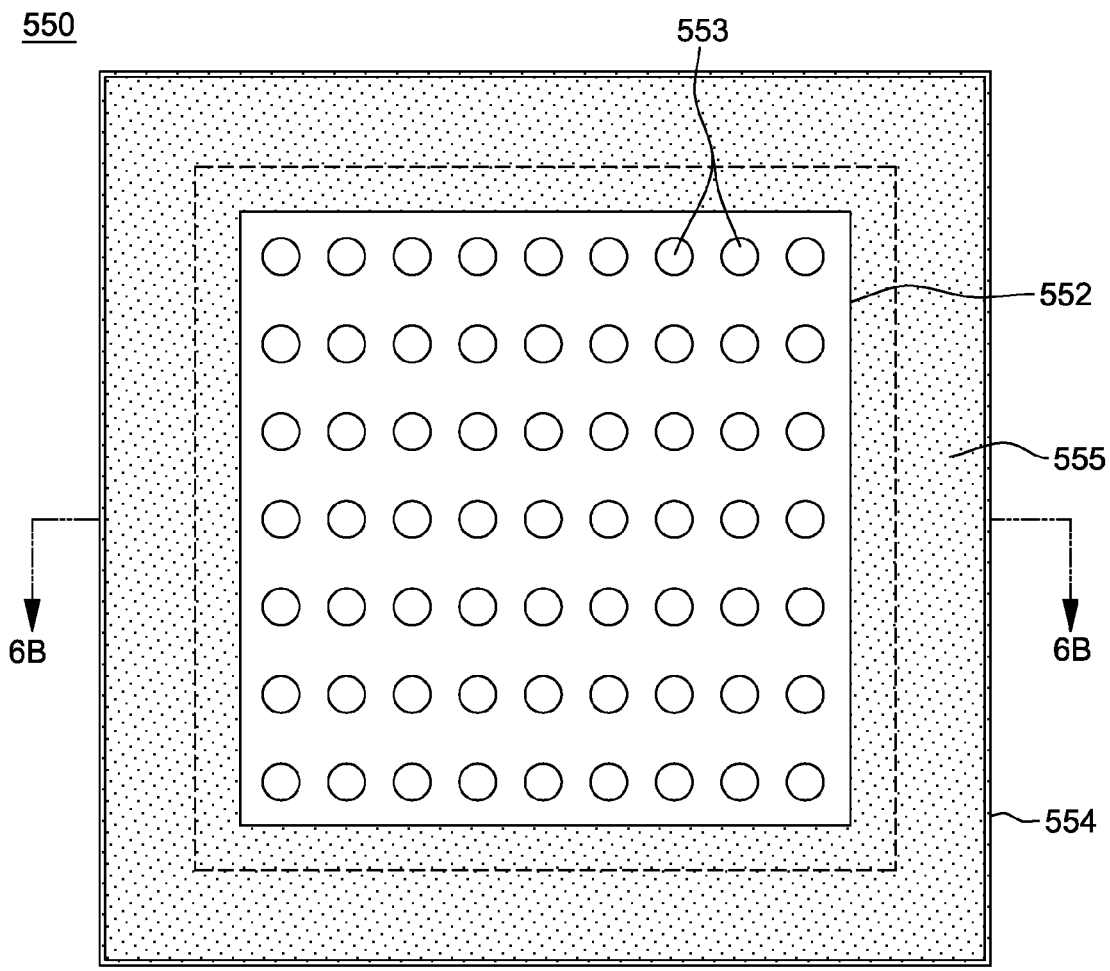
FIG. 6A depicts a top plan view of the deionization structure of the cooling apparatus depicted in FIG. 5, in accordance with one or more aspects of the present invention.
Figure 6B:
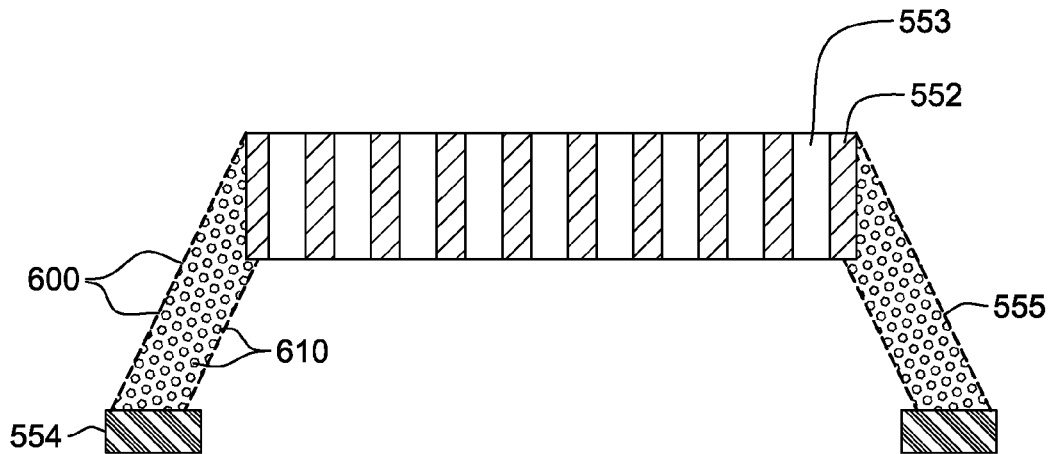
FIG. 6B is a cross-sectional elevational view of the deionization structure of FIG. 6A, taken along line 6B-6B thereof, in accordance with one or more aspects of the present invention.

FIGS. 5, 6A & 6B depict one embodiment of a deionization structure 550 configured for and disposed within compartment 521 of the cooling apparatus. As illustrated, deionization structure 550 includes a pedestal 554 for attaching the structure 550 to, for example, substrate 513 or printed circuit board 501. In the embodiment, illustrated, deionizing structure 550 comprises a dome or frustum shape, and includes a capping plate 552 with a plurality of vapor release openings 553. A deionization, cartridge-type shell 555 forms the sidewalls of the deionization structure and includes fluid openings 600 on both the inner wall and the outer wall to allow fluid to pass through the shell. The shell comprises, in one embodiment, a polymer casing which contains the deionization material. In one embodiment, the deionization material comprises cation and anion spherical resin particles. The fluid openings are sized sufficiently small to ensure that these particles remain contained within the shell. As shown in FIG. 5, the deionization structure at least partially surrounds and forms a secondary, boiling compartment 551 about electronic component 511 to be cooled.

In one embodiment, the fluid charge in the compartment is deionized water, and the deionization structure is a passive deionization cap which covers the electronic component to be cooled, and forms a secondary, boiling chamber about the electronic component to be cooled within which the fluid boils, for example, from one or more surfaces of the electronic component. The deionization structure is, in one embodiment, a dome-like structure, with the top portion comprising a flat, capping plate that does not contain deionization properties, but has openings to allow vapor to escape upwards from the periphery of the electronic component. As noted, the deionization structure is designed to last for the anticipated lifetime of product operation, for example, five years or more. The walls of the deionization structure may be sloped, and the shape of the structure dome-shaped to force vapor to be released upwards towards the top of the structure, in a smaller, central region of the structure, which limits the chances of condensing water re-entering the boiling chamber 551 via the top vapor release openings (and thus bypassing the deionization material). The sloped walls and dome-shaped or frustum-shaped structure further facilitates exposing a larger portion of the deionization material (for example, deionizer pellets) to the water condensate, thereby increasing the amount of fluid 556 forced to flow through the deionization cartridge-type shell 555.

In one example, the deionization material comprises a commercial resin material, such as ResinTech MBD-10-SC, which is a mixture of hydroxide from Type One strong base gel anion exchange resin and hydrogen from strong acid sulfonated gelular polystyrene cation exchange resin, offered by ResinTech, Inc., of West Berlin, N.J., U.S.A. Physical properties of this material include:

| Functional Structure | |
| --- | --- |
| Cation (Hydrogen form) | $RSO_3^-H^+$ (Gel) |
| Anion (Hydroxyl form) | $R_4N^+OH^-$ (Type One Gel) |
| Physical Form | Tough, Spherical Beads |
| Screen Size Distribution | |
| +16 mesh (U.S. Std.) | <2 percent |
| −45 mesh (U.S. Std.) | <2 percent |
| Volume Ratio (as shipped): | |
| Cation | 40 percent |
| Anion | 60 percent |
| Total Capacity | |
| Cation | 1.95 meq/mL min. ($Na^+$ form) |
| Anion | 1.40 meq/mL min. ($Cl^-$ form) |
| Column Operating Capacity | Initial cycle |
| Electrolyte Breakthrough | 0.60 meq/mL (13 Kgrs/cu. ft.) min. |
| Moisture Content (as shipped) | 60 percent max. |
| Maximum Operating Temperature | |
| Non-regenerable | 80° C. (175° F.) |
| Regenerable | 60° C. (140° F.) |
| Operating Flow Rate | 2 to 10 gpm/cu. ft. (typical) |
| pH Range | 0-14 |
| Metals Content | (typical ppm dry wt) |
| Iron (Fe) | <100 |
| Copper (Cu) | <50 |
| Lead (Pb) | <50 |

In operation, as the fluid (e.g., water) absorbs heat, the fluid in the secondary, boiling compartment 551 undergoes phase change from liquid phase to vapor phase, and thus utilizes its latent heat of vaporization for cooling purposes. The vapor 523 generated travels upwards through the vapor release openings 553 in the capping plate 552 of the deionization structure 550, since the vapor possesses a much lower density compared with the surrounding liquid. Upon reaching the upper portion of compartment 521, the fluid vapor comes in contact with the cooled surfaces of the vapor condenser 540, such as the surfaces of the condenser fins 541. These condenser fins are cooled by means of thermal conduction coupling to, for example, liquid-cooled cold plate 530. On making contact with these cool, vertical surfaces, the water vapor undergoes a second phase change process from vapor to liquid state, and the liquid droplets fall back downwards due to gravity and their relatively higher density compared with the neighboring vapor region. Liquid fluid 522 in the bottom portion of the compartment 521 is drawn from the high-pressure side of the deionization structure 550 to the lower-pressure side, to replace the vapor that exits the boiling compartment 551. As long as the boiling and condensation cooling processes are in equilibrium, and are commensurate with the heat generated by the electronic component, the cooling apparatus will successfully transport heat from the electronic component to the liquid-cooled cold plate. Note that in the configuration illustrated, the top inside portion of the vapor condenser may comprise a thin layer made up of non-condensable gases, such as air, which may leave the liquid and travel upwards. Also note that, while illustrated with a liquid-cooled cold plate, an air-cooled heat sink could alternatively be employed in combination with the housing 520 of the cooling apparatus.

As described above, fluid port 525 extends through housing 520. This fluid port is a sealable structure used to fill compartment 521 with a desired amount of water-based fluid 522. This can be accomplished by drawing a vacuum to result in a sub-atmospheric pressure inside the compartment in a normal operating environment. It is desirable to create sub-atmospheric pressure within the compartment because water boils at 100° C. under atmospheric conditions, and to cause the water to boil at a much lower temperature, a partial vacuum is utilized. To cool electronic components that have a maximum allowable temperature, which could be in the 60°-100° C. range, it is necessary to have water that boils in the 30°-60° C. range, thus requiring a vacuum. While it is desirable for the water to boil at a temperature less than the 100° C., it is still practical to design the cooling apparatus to contain water that boils at a temperature that is sufficiently above ambient room temperature.

Figure 7A:
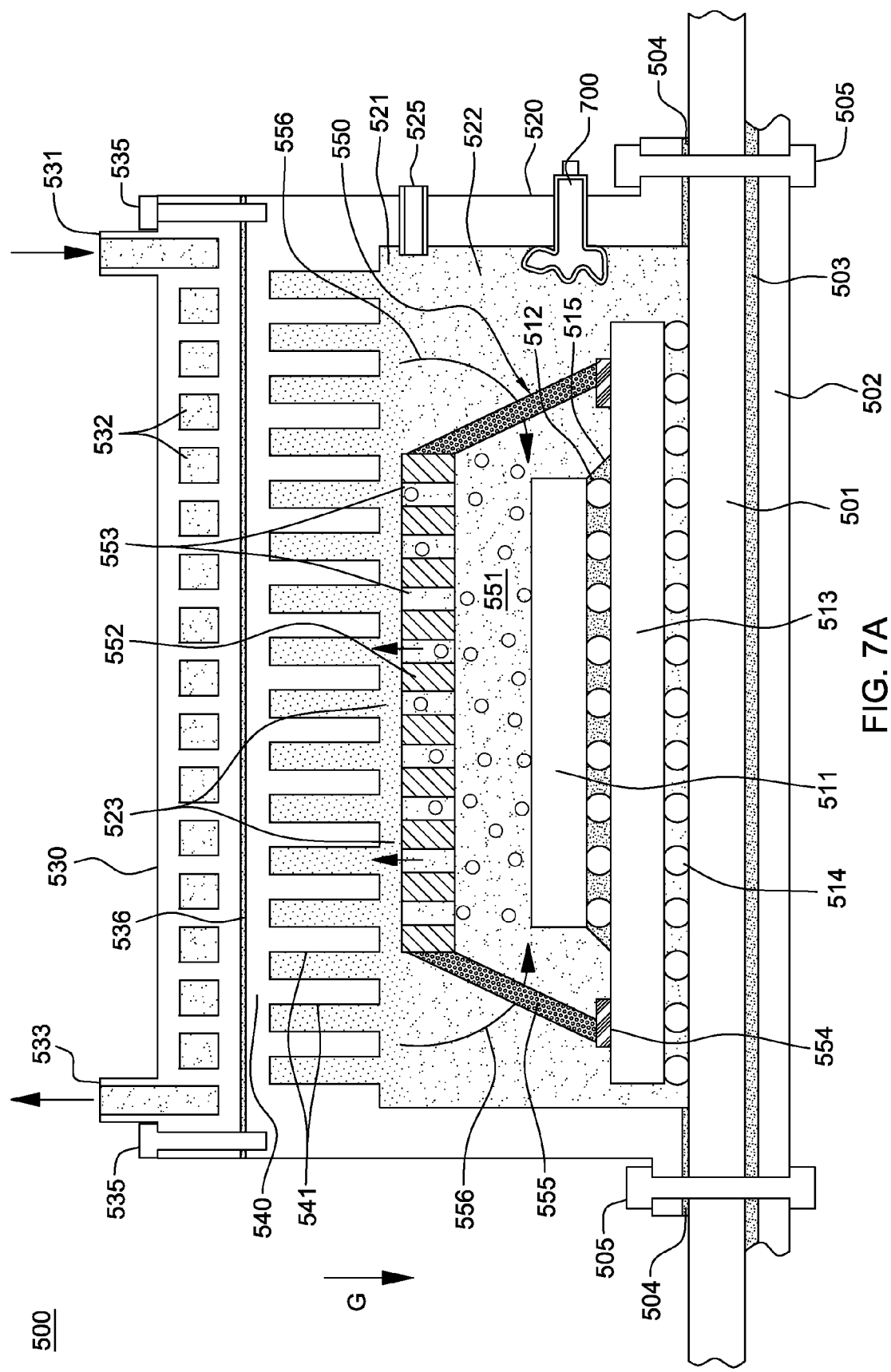
FIG. 7A is a cross-sectional elevational view of an alternate embodiment of a cooled electronic module, in accordance with one or more aspects of the present invention.
Figure 7B:
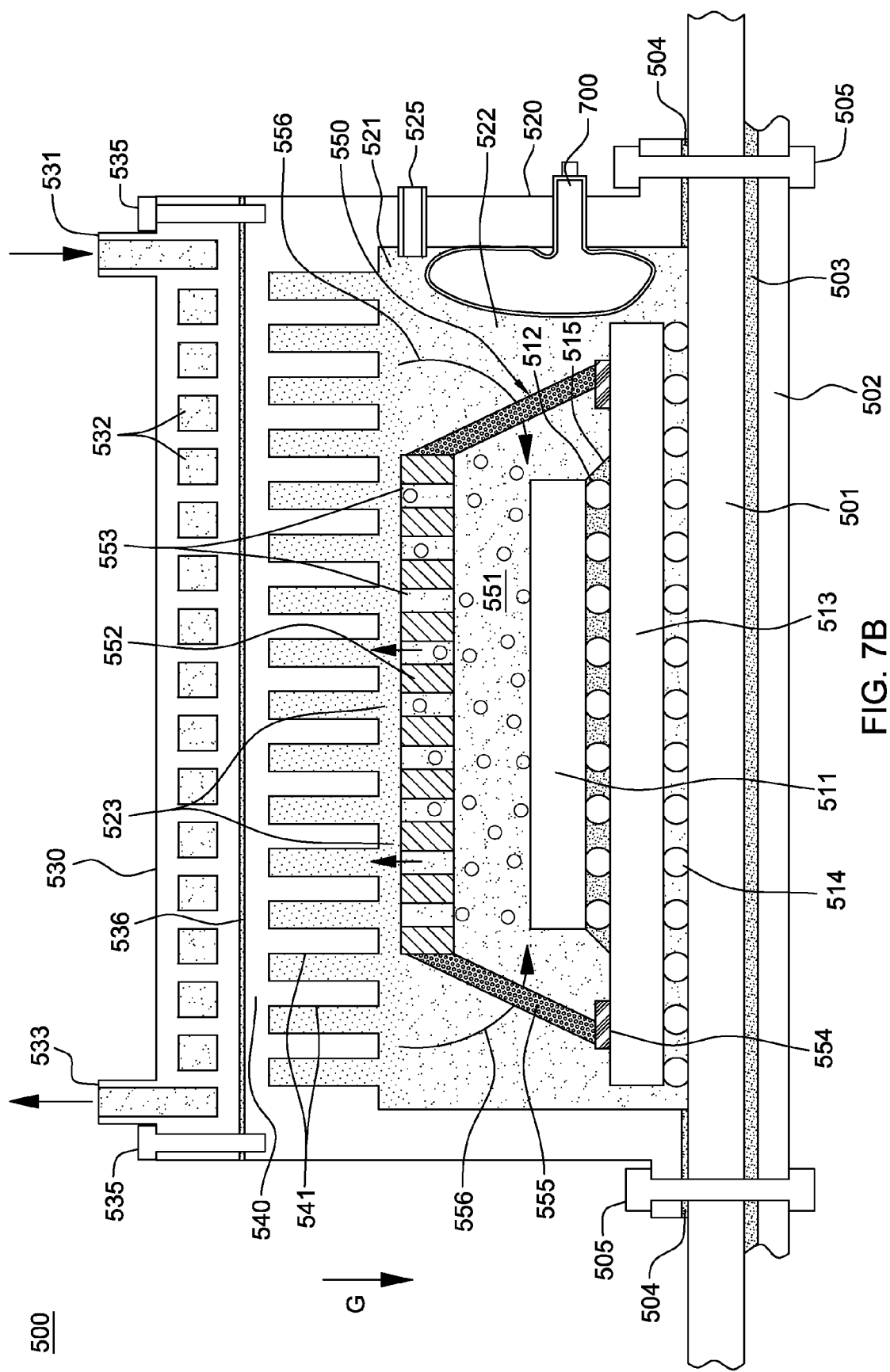
FIG. 7B is a cross-sectional elevational view of the cooled electronic module of FIG. 7A, with the controllable diaphragm shown inflated to pressurize the compartment of the cooling apparatus, in accordance with one or more aspects of the present invention.

FIGS. 7A & 7B depict an alternate embodiment of a cooled electronic module 500', in accordance with an aspect of the present invention. This alternate embodiment of the cooled electronic module is substantially identical to that described above in connection with FIGS. 5-6B. The exception is the provision of an inflatable diaphragm 700 extending through housing 520 into compartment 521. The inflatable diaphragm, which is shown depressurized in FIG. 7A, and pressurized in FIG. 7B, is a pressure regulation structure that can be inflated to varying degrees of inflation to correspondingly reduce the open volume inside compartment 521 by varying degrees, thus allowing the pressure inside the compartment to be adjusted. By changing the pressure inside the compartment, the working fluid can be made to boil at different temperatures, thus allowing for control of the electronic component temperature, or control of the cooling capability of the cooling apparatus.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method of fabricating a cooled electronic module comprising:
   securing a housing about an electronic component to be cooled, the housing at least partially surrounding and forming a compartment about the electronic component to be cooled;
   disposing a fluid within the compartment, wherein the electronic component to be cooled is at least partially immersed within the fluid, and wherein the fluid comprises water;
   providing a deionizing structure within the compartment, the deionizing structure comprising deionizing material, the deionizing material ensuring deionization of the fluid within the compartment, wherein the deionizing structure is configured with vapor passages to accommodate boiling of the fluid within the compartment; and
   wherein the deionization structure disposed within the compartment at least partially surrounds and forms a secondary, boiling compartment about the electronic component to be cooled, the deionization structure comprising the vapor passages in an upper portion thereof.

2. The method of claim 1, wherein the deionization structure comprises a deionization shell with openings to allow fluid to pass therethrough, the deionization shell comprising a cartridge-type shell containing the deionization material.

3. The method of claim 2, wherein the deionization material comprises cation and anion spherical resin particles, and the fluid openings in the deionization shell are smaller than the cation and anion spherical resin particles contained within the deionization shell.

4. The method of claim 3, wherein the deionization shell is frustum-shaped, and includes a capping plate comprising the vapor release openings.

5. The method of claim 1, wherein the deionization material is in contact with the fluid within the compartment, and passively deionizes the fluid within the compartment.

6. A method of fabricating a cooled electronic module comprising:
   securing a housing about an electronic component to be cooled, the housing at least partially surrounding and forming a compartment about the electronic component to be cooled;
   disposing a fluid within the compartment, wherein the electronic component to be cooled is at least partially immersed within the fluid, and wherein the fluid comprises water;
   providing a deionizing structure within the compartment, the deionizing structure comprising deionizing material, the deionizing material ensuring deionization of the fluid within the compartment, wherein the deionizing structure is configured with vapor passages to accommodate boiling of the fluid within the compartment; and
   providing a vapor-condenser disposed in an upper portion of the compartment, and facilitating cooling of fluid vapor rising to the upper portion of the compartment, and wherein the method further comprises providing one of a liquid-cooled cold plate or an air-cooled heat sink coupled to the housing and cooling the vapor-condenser disposed in the upper portion of the compartment.

7. A method of fabricating a cooled electronic module comprising:
   securing a housing, about an electronic component to be cooled, the housing at least partially surrounding and forming a compartment about the electronic component to be cooled;
   disposing a fluid within the compartment, wherein the electronic component to be cooled is at least partially immersed within the fluid, and wherein the fluid comprises water;
   providing, a deionizing structure within the compartment, the deionizing structure comprising deionizing material, the deionizing material ensuring deionization of the fluid within the compartment, wherein the deionizing structure is configured with vapor passages to accommodate boiling of the fluid within the compartment; and
   wherein the compartment is a sealed compartment, and wherein the method further comprises providing an inflatable diaphragm at least partially disposed within the compartment, the inflatable diaphragm being controllable to control pressure within the sealed compartment.

* * * * *